United States Patent [19]
Chang et al.

[11] Patent Number: 5,544,309
[45] Date of Patent: Aug. 6, 1996

[54] DATA PROCESSING SYSTEM WITH MODIFIED PLANAR FOR BOUNDARY SCAN DIAGNOSTICS

[75] Inventors: Luke L. Chang, Boca Raton, Fla.; John J. Cazzolla, Fuquay-Varina, N.C.; Kha D. Nguyen, Boca Raton, Fla.

[73] Assignee: International Business Machines Corporation, Armonk, N.Y.

[21] Appl. No.: 52,002

[22] Filed: Apr. 22, 1993

[51] Int. Cl.⁶ ................................................ G06F 11/34
[52] U.S. Cl. .................................................... 395/183.06
[58] Field of Search ............................. 395/575, 183.06, 395/183.01; 371/22.3, 22.1, 22.5

[56] References Cited

U.S. PATENT DOCUMENTS

| | | | |
|---|---|---|---|
| 4,097,797 | 6/1978 | Finet | 324/73 |
| 5,132,635 | 7/1992 | Kennedy | 371/22.3 |
| 5,185,745 | 2/1993 | Manca, Jr. | 371/22.3 |
| 5,243,273 | 9/1993 | McAuliffe et al. | 371/22.1 |
| 5,257,393 | 10/1993 | Miller | 395/575 |

OTHER PUBLICATIONS

Computer System Architecture, M. Marris Mano, 2nd Edition, Prentice–Hall, 1982(pp. 266–268).

*Primary Examiner*—Robert W. Beausoliel, Jr.
*Assistant Examiner*—Trinh L. Tu
*Attorney, Agent, or Firm*—Bernard D. Bogdon

[57] ABSTRACT

A boundary scan system for a data processing system using serial scan techniques for diagnostics comprises gated circuitry for each adapter card slot for controlling the propagation of controller generated diagnostic signals throughout the data processing system and the components included on the system's planar and each adapter card present, adapted to serially scan all present adapter cards and to provide electrical conduit to the next serially connected component in the absence of a card at an adapter slot.

7 Claims, 4 Drawing Sheets

DATA PROCESSING SYSTEM WITH MODIFIED PLANAR FOR BOUNDARY SCAN DIAGNOSTICS

FIELD OF THE INVENTION

The invention relates to a data processing system using serial scan techniques in diagnostic routines and testing. More particularly, the invention relates to a data processing system with a multiplicity of insertable printed circuit board cards having provision for serial boundary scan diagnostic testing capability when one or more system slots for accommodating card connection to the bus is vacant.

BACKGROUND OF THE INVENTION

Personal computer systems in general, and IBM personal computers in particular, have attained widespread use for providing computer power to many segments of today's society. A personal computer system can usually be defined as a desktop, floor standing, or portable computer that includes a system unit having a system processor, a display monitor, a keyboard, one or more diskette drives, a fixed disk storage, an optional pointing device such as a "mouse," and an optional printer. These systems are designed primarily to give independent computing power to a single user or small group of users and are inexpensively priced for purchase by individuals or businesses. Examples of such personal computer systems are sold under trademarks and include IBM's PERSONAL COMPUTER, PERSONAL COMPUTER XT, PERSONAL COMPUTER AT and IBM's PERSONAL SYSTEM/2 Models 25, 30, 50, 55, 56, 57, 60, 65, 70, 80, 90 and 95 (hereinafter referred to as the IBM products PC, XT, AT, and PS/2, respectively).

These systems can be classified into two general families. The first family, usually referred to as Family 1 Models, uses a bus architecture exemplified by the AT computer and other so called IBM compatible machines. The second family, referred to as Family 2 Models, uses IBM's MICRO CHANNEL bus architecture exemplified by IBM's PS/2 models 50 through 95. The bus architectures used in Family 1 and Family 2 Models are well known in the art.

Beginning with the earliest personal computer system of the Family 1 Models, the IBM PC, and through the current Family 2 Models, the system processor of the personal computer is from the Intel 86 family of microprocessors. The Intel 86 family of processors includes the 8088, 8086, 80286, 80386, and 80486 processors commercially available from Intel Corporation. The architecture of the Intel 86 family of processors provides an upwardly compatible instruction set which assists in preserving software investments from previous processors in the 86 family of processors. This upward compatibility preserves the software application base of the personal computers which use this family of processors. A variety of commonly available and well known software operating systems, such as a DOS or an OS/2 operating system, operate on various members of the Intel 86 family of processors.

Due to the ever increasing functional requirements in today's electronic systems brought about by the myriad of processors and their capabilities, the number of circuits being integrated into an integrated circuit (IC), as well as the number of IC's being integrated on a circuit board and the number of circuit boards being included in a system, such as a personal computer system, are being increased dramatically. Testing of such a densely packed system becomes more and more difficult. A testing standard presented by IEEE (P1149.1), which is identical to the testing standard adopted by Joint Test Action Group (JTAG) of Europe and North America was developed to address this issue. In these standards, a boundary scan technique or test protocol is presented to serially scan all the devices under test with a test data input (TDI) signal from a JTAG control unit, and the returned scan test data output (TDO) signal is looped back to JTAG control unit. By comparing the predefined serial signal pattern sent out from the JTAG control unit with the returned serial signal pattern, after it has been scanned through the identified devices, the operational readiness of all or certain selected system devices is determined.

In a system configured for options such as multiple plug-in cards, concern arises when the JTAG boundary test is considered to be implemented. In such an instance, a serial scan signal is scanned through from card to card via card connectors at card slots or at stations where electronic components or devices, including component boards, are plugged in or inserted and from which, as is usually desirous, such components and devices are readily removable. When the system is not fully populated with such components, devices or cards, a need exists to conduct a serial scan without interruption, regardless of which of the card slots or stations is occupied.

In solving this problem, there are many potential different approaches. Cost and reliability are two major deciding factors in selecting an implementation. A reliable and cost effective design, which is not overly complex, is essential. When making a test algorithm feasible, in an otherwise already complex system, it is important not to add more reliability problems to the existing system. To do so would defeat the whole purpose of the initial testing. Also it is desirable to accomplish the testing without the need to include additional signal pins.

SUMMARY OF THE INVENTION

The invention discloses a system that will enable serial boundary scan test data to be scanned through all system components, including planar and plug-in cards, without the need of the physical presence of all such components or plug-in cards. This is true of personal computer systems as well as switching systems, telephone systems or any system with plug-in electronic devices or items. With the present invention the test procedure or protocol can be effected regardless of the presence or absence of a tested component, device, circuit board, card or similar such electronic item. This accommodation is accomplished through a gating system for each tested item which provides an inexpensive by-pass where an item which would otherwise be tested is not present. This innovation is equally applicable to planar and card-on-board (COB) configurations as well as modules which are plug-ins or insertable.

BRIEF DESCRIPTION OF THE DRAWINGS

Further and still other objects of the present invention will become more readily apparent in light of the following description when taken in conjunction with the accompanying drawings, in which.

DETAILED DESCRIPTION OF AN ILLUSTRATIVE EMBODIMENT

Figure 1:
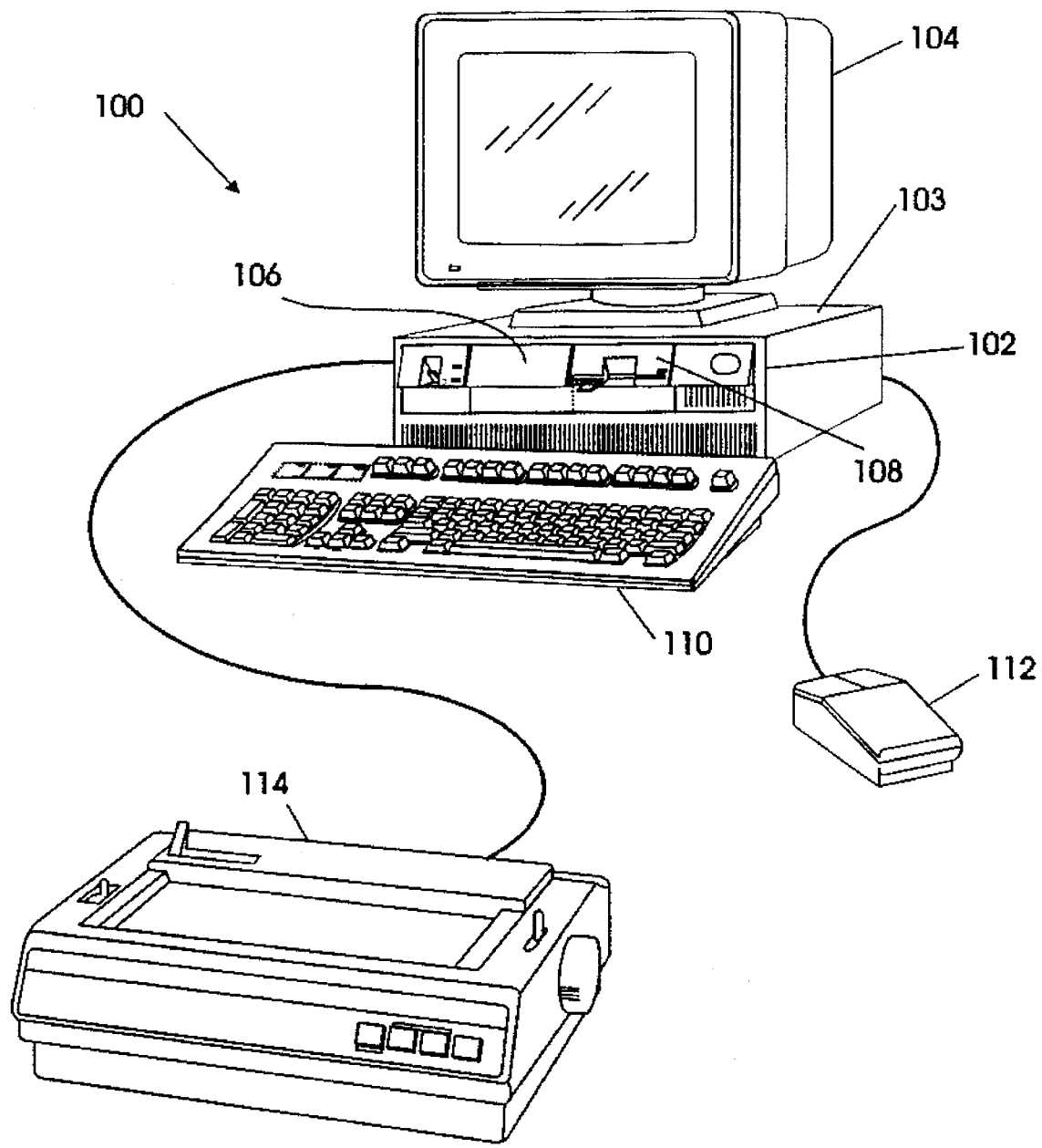
FIG. 1 is a perspective view of a typical personal computer system for incorporation of the present invention.

Referring to FIG. 1, there is shown a personal computer system 100 which employs the present invention. The personal computer system 100 includes a system unit 102 having a suitable enclosure or casing 103, output device or monitor 104 (such as a conventional video display), input devices such as a keyboard 100, an optional mouse 112, and an optional output device such as a printer 114. Finally, the system unit 102 may include one or more mass storage devices such as a diskette drive 108 (operable with a diskette—not shown) and a hard disk drive (hardfile) 106.

Figure 2:
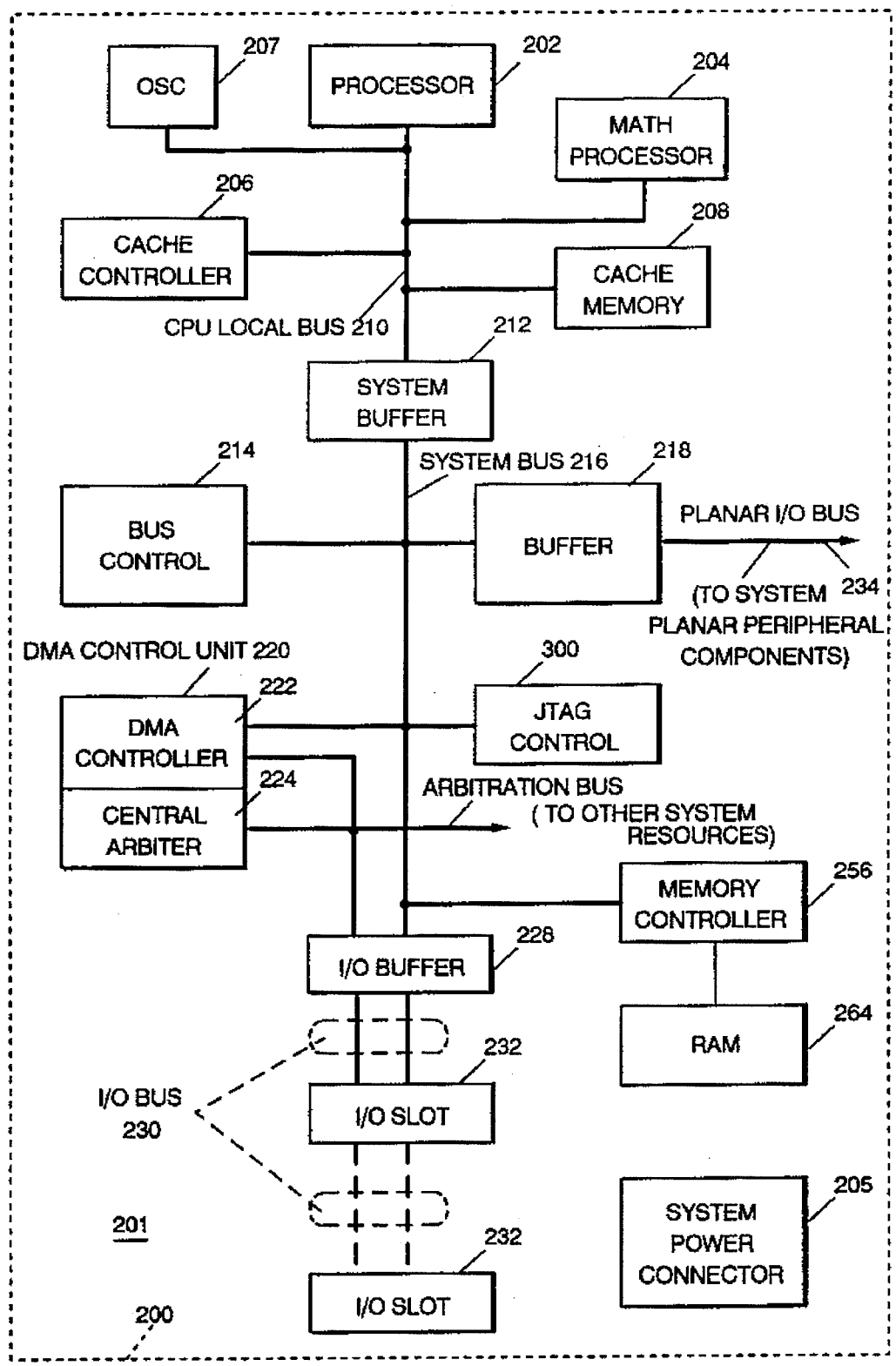
FIG. 2 is a block schematic diagram of a unified planar board for the computer system of FIG. 1.

Referring to FIG. 2, there is shown a block diagram of a unified planar 200 of the system unit 102. The planar 200 includes a printed circuit board (PCB) 201 upon which are mounted or connected a number of input/output bus connectors 232 having I/O slots, a processor 202 which is connected by a high speed CPU local bus 210 under control of a bus control unit 214 to a memory control unit 256. The unit 256 is further connected to a main memory such as volatile random access memory (RAM) 264. Any appropriate processor 202 can be used such as an Intel 80386, Intel 80486 or the like. A system power connector 205 is mounted on the PCB 201 for connection to a power unit (not shown) that supplies the necessary power for the system 100.

The CPU local bus 210 (comprising address, data and control components) provides for the interconnection of the processor 202, an optional math coprocessor 204, an optional cache controller 206, and an optional cache memory 208. Also coupled onto the CPU local bus 210 is a system buffer 212. The system buffer 212 is itself connected to a system bus 216 which comprises address, data and control components. The system bus 216 extends between the system buffer 212 and I/O buffer 228. The system bus 216 is further connected to the bus control unit 214, a direct memory access (DMA) control unit 220 and a JTAG control unit 300. The DMA control unit 220 includes a central arbiter 224 and a DMA controller 222. The JTAG control unit 300 provides the boundary scan test data and control for the illustrated embodiment. The I/O buffer 228 provides an interface between the system bus 216 and an I/O bus 230. An oscillator 207 is connected, as shown, for providing suitable clock signals to the computer system 100. A buffer 218 is coupled between the system bus 216 and a planar I/O bus 234. The planar I/O bus 234 includes address, data, and control components. Coupled along the planar I/O bus 234 are a variety of I/O adapters and other peripheral components.

Figure 3:
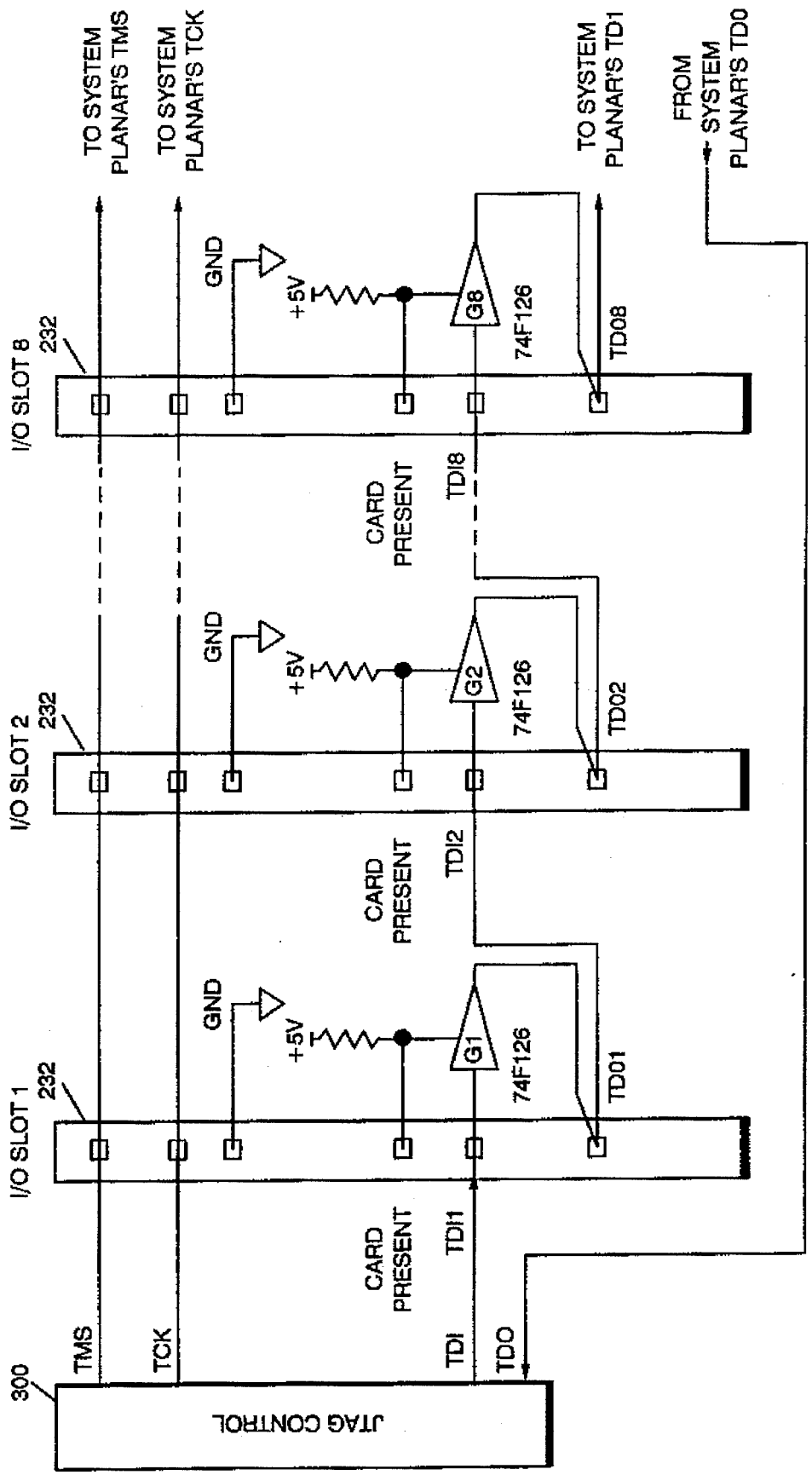
FIG. 3 is a block schematic diagram of a boundary scan implemented I/O bus connector according to the principles of the present invention.
Figure 4:
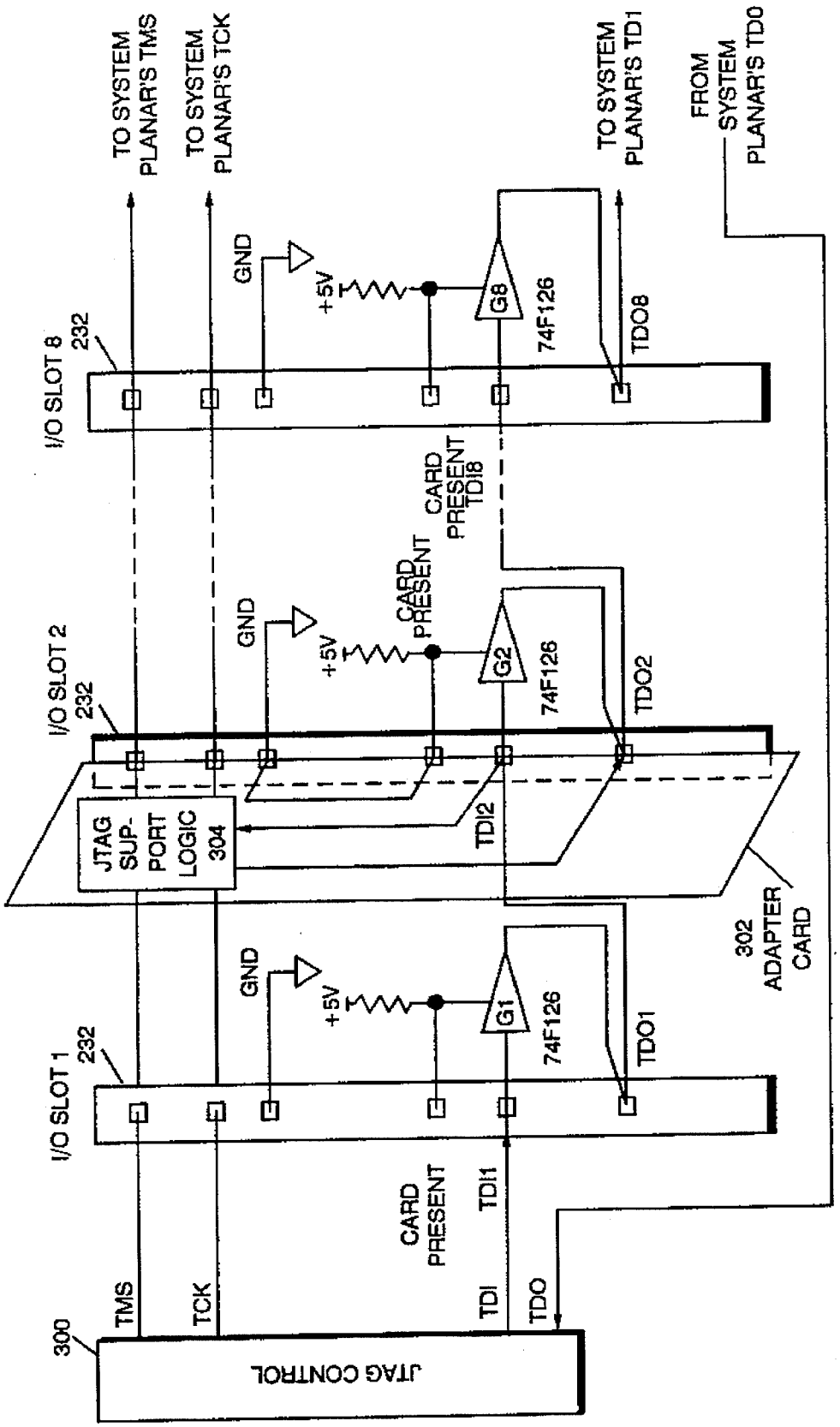
FIG. 4 is a block schematic diagram of a boundary scan implemented I/O bus connector with exemplary plug-in card.

Connected to the I/O bus 230 is a plurality of I/O bus connectors having accommodating slots 232 for receiving adapter cards as illustrated, in exemplary fashion, in FIGS. 3 and 4, which may be further connected to I/O devices or memory (e.g., hardfile 106). Only two I/O connectors 232 are shown for convenience, but additional I/O connectors may easily be added to suit the needs of a particular system. The I/O bus 230, a Micro Channel bus in this example, can be any type of I/O bus (industrial standard I/O buses or proprietary I/O buses). The procedure this invention teaches is applied, in an exemplary manner, to the implementation of JTAG boundary scan test on the I/O bus.

Boundary scan has become an emerging card level test method in the electronic system design environment. The basic working principle is to enable a controller programmed to carry out a given protocol to send (scan in) a serial test data stream to all specific components or a specific component in the system or module and then to receive (scan out) a serial data stream from all the specific components or the specific component or module. By using this method the controller can conduct various testings for maintenance, diagnostic, fault isolation or component buildin self test (BIST) purposes. Generally speaking any of the terms which connote testing or such a similar procedure or protocol are meant to be interpreted in their broadest sense as applied to the present innovation.

Certain systems include circuits composed of a planar, such as planar 200 as shown in FIG. 2, on which all the common circuits and eight card slots reside and, as an example, a planar may contain eight switch port cards plugged into the eight plug-in card slots.

In order to carry out the boundary scan test, all the major large scale integration (LSI) or very large scale integration (VLSI) components in the system, including all the common VLSI components on the planar and all the VLSI components on all the switch port cards, need to be scanned in and out with serial test data stream. Operational requirements may be such that not all the card slots will be populated for all the different systems. Depending upon system requirements, some systems may only need one or two switch port cards. Passing the serial test scan data stream through those slots without a card plugged in is less burdensome, efficient and inexpensive when done within the principles of the present invention.

Referring now to FIG. 3, based on the industry boundary scan standard (JTAG/IEEE P1149.1), four signals are required. They are test data input (TDI), test data output (TDO), test clock input (TCK) and test mode select input (TMS). These signals may, for example, be controlled by the previously identified JTAG control circuit 300. This control circuit is specified in the JTAG standard and is central to the testing procedure, but is a collateral feature of this disclosure. Signals TCK and TMS are bused signals (i.e. they are common to the system planar and all the plug-in cards).

As illustrated, by way of example, each I/O slot has a card present pin and every card slot has a serial test data input pin (TDIn) and a serial test data output pin (TDOn), both of which are respectively numbered for each slot. The TDI signal from the JTAG control circuit 300 will be connected to the first card slot's TDI pin (TDI1) and the TDO pin (TDO1) of the 1st card slot will be connected to the TDI pin (TDI2) of the next card slot 2. Connections in the same order will be propagated through all available card slots. The last card slot's TDO pin (TDO8) will propagate to the system planar 200. The system planar TDO signal will be connected back to the JTAG control circuit's TDO pin so that the test data can be scanned serially from JTAG control circuit 300 through the planar 200 and all cards in the system (e.g. those in slots 1–8) and back to the JTAG control circuit 300. The ground (GND) pins shown in FIGS. 3 and 4 have presented to them the regular system ground signals which go to every card slot. TDI and TDO signals need to be passed from card to card serially to complete the boundary scan loop.

Eight tri-stateable pass gates, G1 through G8, as best seen in FIG. 4, comprise, as for example, two 74F126 tri-stateable logic buffers modules and are added to the planar

201, as shown in FIG. 2. Each such module has four gates. One gate is included for each card slot. The input of this gate is connected directly to the TDI pin of the corresponding card slot and the output of the gate is connected directly to the TDO pin of the same card slot. The tri-state control (high—gate on; low—gate off) pin for each gate G1 through G8, is respectively directly connected to the card present pin of the corresponding card slot with a pull-up resistor connected to +5 volts. The card present pin will be grounded if a card is plugged into the card slot. If there is no card present, the signal is pulled up by the pull-up resistor to a logic high value.

In FIG. 4, for example, only slot 2 is occupied and all the other slots are unpopulated. Since slot 1 is not occupied, the gate G1's enable line is pulled up to high level so G1 is enabled. The TDI signal from the JTAG control circuit is directly passed through the TDI1 pin to G1's input pin and it is then outputted from G1's output pin to the TDO1 pin.

Now the serial test data is passed from TDO1 of the first card slot to TDI2 pin of the 2nd card slot. Card slot 2 is occupied with adapter card 302. The card present pin of the adapter card 302 in card slot 2 is connected to the system ground pin directly. Because the card present pin is connected to the enable pin of G2, gate G2's enable pin now is grounded through the adapter card 302 and gate G2 is disabled. Therefore the output of gate G2 is tri-stated and it will not interfere with the signal on pin TDO2 occurring as a result of the propagated signal through adapter card 302. Accordingly, the serial test data which is passed from TDI2 through the JTAG support logic 304 on the adapter card 302 is outputted on TDO2 pin.

Since card slots 3 through 8 are not occupied in the example of FIG. 4, the description for card slot 1 is applicable to all of slots 3 through 8. Serial test data from TDO2 will be passed from card slot 3 through to 8 and to the system planar and then back to the JTAG control circuit 300 without any interruptions.

Therefore, when a card is plugged into a slot, the tri-state gate will be in the high-impedance off state. The output of that respective gate is not going to interfere with the signal on the TDO pin of the card in that slot. When a card is not present, the gate control signal will be pulled to a high value. The output of this gate will be reflecting the value of the input with some propagation delay. Since there is no card present, the TDO pin will not have any other signal present and the input signal (TDI) of this gate will be propagated to the next card's TDI pin. The boundary scan chain of the TDI and TDO signals will not be interrupted regardless of whether the card is physically present or not.

This inventive system solves the boundary scan problem with minimum amount of added circuitry and without adding any signal to the card connector. The card present signal is an existing signal. This system approach can also be applied to any removable component provision in the system for boundary scan purposes.

While a preferred embodiment of the present invention was described above, it will be understood by those skilled in the art that various changes in detail may be made without departing from the spirit, scope, and teaching of the invention. For example, while the illustrative embodiment uses Intel processors and an IBM PS/2 MICRO CHANNEL bus for illustration, this invention can be implemented on other processors and/or bus types, other data processing systems and any system for boundary scan testing. Likewise, those skilled in the art will recognize that many elements of the invention can be implemented either in hardware or software. Accordingly, the invention should be limited only as specified by the appended claims.

What is claimed is:

1. A personal computer test system, incorporated within a personal computer, for use in accordance with a boundary scan test protocol for serially testing a data processing system within the personal computer having one or more card slots or stations for receiving data processing circuit devices, the personal computer test system comprising:

control means for generating serial test data signals in accordance with the boundary scan test protocol to serially scan in the serial test data signals to the card slots and stations for receiving data processing circuit devices and to scan out serial test data signals from the card slots and stations for receiving data processing circuit devices; and circuit means connected to each respective card slot and station for receiving data processing circuit devices for receiving the serial test data signals from the control means for either scanning in the serial test data signals to the card slot or station having a data processing circuit device or for scanning out the serial test data signal to the next succeeding serially connected card slot or station for receiving a data processing circuit device in the absence of a data processing circuit device at the respective card slot or station for receiving a data processing circuit device, wherein the circuit means includes a conduit circuit, for scanning in the serial test data signals to scan test the respective data processing circuit device at the respective card slot or station for receiving a data processing circuit device and to scan out the serial test data signals from the data processing circuit device at the respective card slot or station for receiving a data processing circuit device, and wherein the circuit means further includes a gate logic circuit, for scanning out the serial test data signals received from the control means in the absence of a data processing circuit device at the respective card slot or station for receiving a data processing circuit device (i) to a next succeeding serially connected card slot or station for receiving a data processing circuit device or (ii) to the control means for serially testing the data processing system in accordance with the boundary scan test protocol in the absence of a next succeeding card slot or station for receiving a data processing circuit device which card slot or station is in receipt of a data processing circuit device.

2. A data processing system having connecting slots and stations for receiving plug-in data processing components, including I/O adapters and peripheral components, and configured for uninterrupted serial boundary scan diagnostic testing of the plug-in data processing components within the data processing system, comprising:

a central processing unit (CPU) for controlling data within the data processing system;

a CPU local bus connected to the central processing unit for transmission of the data controlled by the central processing unit;

a system bus connected to the CPU local bus for providing further means for transmission of the data and for access to the I/O adapters and the peripheral components;

a controller connected to the system bus for generating diagnostic scan signals in accordance with a boundary scan protocol for serially scanning the diagnostic scan signals through the data processing system including the connecting slots and stations for receiving the plug-in data processing components; and gate control logic means at each of the connecting slots and stations for receiving the diagnostic scan signals from the controller and for scanning in the diagnostic scan signals to the plug-in data processing components at the connecting slots and stations which are in receipt of the plug-in data processing components, and for passing the diagnostic scan signals in serial sequence from the plug-in data processing components to the next serially connected connecting slot or station for receiving plug-in diagnostic components for passing the diagnostic scan signals to the plug-in data processing components connected at said next serially connected connecting slot or station or, in the absence of plug-in data processing components connected at said next serially connected slot or station, for passing the diagnostic scan signals to the next succeeding serially connected connecting slot or station for receiving plug-in data processing components to thereby provide for uninterrupted serial boundary scan diagnostic testing of the plug-in data processing components at each connecting slot and station within the data processing system even in the absence of plug-in data processing components at any respective connecting slot or station.

3. The data processing system as defined in claim 2, configured for uninterrupted serial boundary scan diagnostic testing wherein each gate control logic means comprises a tri-state gate.

4. The data processing system as defined in claim 3, configured for uninterrupted serial boundary scan diagnostic testing wherein the diagnostic scan signal passes through the tri-state gate in the absence of plug-in data processing components at the respective connecting slot or station.

5. A data processing system having connecting slots and stations for receiving plug-in data processing components, including I/O adapters and peripheral components, and configured for uninterrupted serial boundary scan diagnostic testing of the plug-in data processing components within the data processing system, comprising:

a central processing unit (CPU) for controlling data within the data processing system;

a CPU local bus connected to the central processing unit for transmission of the data controlled by the central processing unit;

a system bus connected to the CPU local bus for providing further means for transmission of the data and for access to the I/O adapters and the peripheral components;

a controller connected to the system bus for generating diagnostic scan signals in accordance with a boundary scan protocol for serially scanning the diagnostic scan signals through the data processing system including the connecting slots and stations for receiving the plug-in data processing components; and gate control means comprising a tri-state gate at each of the connecting slots and stations for receiving the diagnostic scan signals from the controller and for scanning in the diagnostic scan signals to the plug-in data processing components at the connecting slots and stations which are in receipt of the plug-in data processing components, and for passing the diagnostic scan signals in serial sequence from the plug-in data processing components to the next serially connected connecting slot or station which is in receipt of the plug-in data processing component, or in the absence of plug-in data processing components connected at said next serially connected slot or station, for passing the diagnostic scan signals through the tri-state gate to the next succeeding serially connected connecting slot or station for receiving plug-in data processing components to thereby provide for uninterrupted serial boundary scan diagnostic testing of the plug-in data processing components at each connecting slot and station within the data processing system even in the absence of plug-in data processing components at any respective connecting slot or station.

6. The data processing system as defined in claim 5, configured for uninterrupted serial boundary scan diagnostic testing wherein any tri-state gate is in a high impedance off state and blocks the diagnostic scan signals from by-passing any of the inserted data processing components at the respective connecting slot or station.

7. The data processing system as defined in claim 3, configured for uninterrupted serial boundary scan diagnostic testing wherein, in the absence of any of the data processing components inserted at any of the respective connecting slots or stations, the respective tri-state gate is enabled and the diagnostic scan signals are scanned in serial sequence in accordance with the boundary scan protocol for serially scanning the diagnostic scan signals through the data processing system, including the slots and stations for receiving the plug-in data processing components.

* * * * *